United States Patent
Perlmutter

(10) Patent No.: US 10,783,982 B2
(45) Date of Patent: Sep. 22, 2020

(54) PROBATION BIT FOR DATA STORAGE MEMORY

(71) Applicant: Seagate Technology LLC, Cupertino, CA (US)

(72) Inventor: Stephen H. Perlmutter, Louisville, CO (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/263,640

(22) Filed: Jan. 31, 2019

(65) Prior Publication Data
US 2019/0378589 A1 Dec. 12, 2019

Related U.S. Application Data

(60) Provisional application No. 62/683,935, filed on Jun. 12, 2018.

(51) Int. Cl.
| | | |
|---|---|---|
| *G11C 7/10* | (2006.01) | |
| *G11C 29/52* | (2006.01) | |
| *G11C 16/06* | (2006.01) | |
| *G06F 11/10* | (2006.01) | |

(52) U.S. Cl.
CPC .......... *G11C 29/52* (2013.01); *G06F 11/1016* (2013.01); *G11C 16/06* (2013.01); *G06F 2201/88* (2013.01)

(58) Field of Classification Search
CPC ..... G11C 29/52; G11C 16/06; G06F 11/1016; G06F 2201/88
USPC ...................................................... 365/185.09
See application file for complete search history.

(56) References Cited

U.S. PATENT DOCUMENTS

| | | |
|---|---|---|
| 8,108,180 B2 | 1/2012 | Astigarraga et al. |
| 9,201,728 B2 | 12/2015 | Patapoutian et al. |
| 9,910,606 B2 | 3/2018 | Khoueir et al. |
| 2013/0173997 A1* | 7/2013 | Suzumura ............ H03M 13/03 714/773 |
| 2013/0262956 A1* | 10/2013 | Haywood ............ G06F 11/073 714/758 |

* cited by examiner

*Primary Examiner* — Huan Hoang
(74) *Attorney, Agent, or Firm* — Hall Estill Attorneys at Law

(57) ABSTRACT

A data storage system can receive a data write request to write data to a physical address of a non-volatile semiconductor memory prior to detecting an error while storing the write data to the physical address. The detected error is corrected with a monitor module connected to the non-volatile semiconductor memory and a counter associated with the physical address is incremented with the monitor module in response to the corrected error. The write data can be subsequently read to a host in response to a data read request.

20 Claims, 6 Drawing Sheets

US 10,783,982 B2

PROBATION BIT FOR DATA STORAGE MEMORY

RELATED APPLICATION

The present application makes a claim of domestic priority to U.S. Provisional Patent Application No. 62/683,935 filed Jun. 12, 2018, the contents of which are hereby incorporated by reference.

SUMMARY

Various embodiments of the present disclosure are generally directed to the management of erasure blocks in a memory, such as, but not limited to, a flash memory in a solid state drive (SSD).

A data storage system, in some embodiments, receives a data write request to write data to a physical address of a non-volatile semiconductor memory prior to detecting an error while storing the write data to the physical address. The detected error is corrected with a monitor module connected to the non-volatile semiconductor memory and a counter associated with the physical address is incremented with the monitor module in response to the corrected error. The write data is then read to a host in response to a data read request.

Other embodiments configure a data storage system to receive a data write request to write data to a physical address of a non-volatile semiconductor memory prior to detecting an error while storing the write data to the physical address. The detected error is corrected with a monitor module connected to the non-volatile semiconductor memory and a counter associated with the physical address is incremented with the monitor module in response to the corrected error. The physical address is deallocated responsive to the counter reaching a selected percentage of a total number of program/erase cycles applied to the physical address.

A non-volatile semiconductor memory, in accordance with various embodiments, has a plurality of physical addresses and is connected to a monitor module. The monitor module maintains a counter stored in the non-volatile semiconductor memory that is incremented by the monitor module in response to correction of a detected error to data written to a physical address of the plurality of physical addresses.

DETAILED DESCRIPTION

Figure 1:
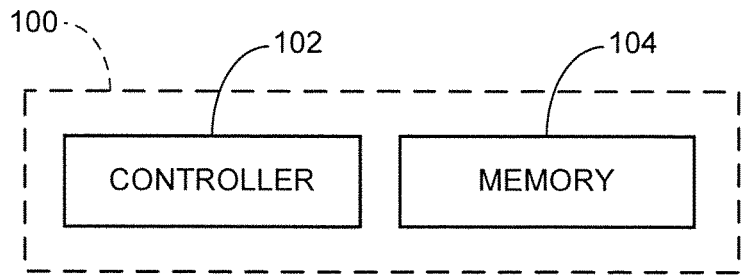
FIG. 1 provides a functional block representation of a data storage device in accordance with various embodiments.

Without limitation, the various embodiments disclosed herein are generally directed to managing data access commands in a data storage device to mitigate the occurrence of command conflicts to various portions of a memory.

Solid state drives (SSDs) are data storage devices that store user data in non-volatile memory (NVM) made up of an array of solid-state semiconductor memory cells. SSDs usually have an NVM module and a controller. The controller controls the transfer of data between the NVM and a host device. The NVM will usually be NAND flash memory, but other forms of solid-state memory can be used.

A flash memory module may be arranged as a series of dies. A die represents a separate, physical block of semiconductor memory cells. The controller communicates with the dies using a number of channels, or lanes, with each channel connected to a different subset of the dies. Any respective numbers of channels and dies can be used. Groups of dies may be arranged into NVMe sets in accordance with the NVMe (Non-Volatile Memory Express) Standard. This standard enables multiple owners (users) to access and control separate portions of a given SSD (or other memory device).

Metadata is often generated and used to describe and control the data stored to an SSD. The metadata may take the form of one or more map structures that track the locations of data blocks written to various GCUs (garbage collection units), which are sets of erasure blocks that are erased and allocated as a unit. The map structures can include a forward map and a reverse directory, although other folios can be used.

The forward map provides an overall map structure that can be accessed by a controller to service a received host access command (e.g., a write command, a read command, etc.). The forward map may take the form of a two-level map, where a first level of the map maintains the locations of map pages and a second level of the map provides a flash transition layer (FTL) to provide association of logical addresses of the data blocks to physical addresses at which the blocks are stored. Other forms of maps can be used including single level maps and three-or-more level maps, but each generally provides a forward map structure in which pointers may be used to point to each successive block until the most current version is located.

The reverse directory can be written to the various GCUs and provides local data identifying, by logical address, which data blocks are stored in the associated GCU. The reverse directory, also sometimes referred to as a footer, thus provides a physical to logical association for the locally stored blocks. As with the forward map, the reverse directory can take any number of suitable forms. Reverse directories are particularly useful during garbage collection operations, since a reverse directory can be used to determine which data blocks are still current and should be relocated before the associated erasure blocks in the GCU are erased.

SSDs expend a significant amount of resources on maintaining accurate and up-to-date map structures. Nevertheless, it is possible from time to time to have a mismatch between the forward map and the reverse directory for a given GCU. These situations are usually noted at the time of garbage collection. For example, the forward map may indicate that there are X valid data blocks in a given erasure block (EB), but the reverse directory identifies a different number Y valid blocks in the EB. When this type of mismatch occurs, the garbage collection operation may be rescheduled or may take a longer period of time to complete while the system obtains a correct count before proceeding with the recycling operation.

The NVMe specification provides that a storage device should have the ability to provide guaranteed levels of deterministic performance for specified periods of time (deterministic windows, or DWs). To the extent that a garbage collection operation is scheduled during a DW, it is desirable to ensure that the actual time that the garbage collection operation would require to complete is an accurate estimate in order for the system to decide whether and when to carry out the GC operation.

SSDs include a top level controller circuit and a flash (or other semiconductor) memory module. A number of channels, or lanes, are provided to enable communications between the controller and dies within the flash memory. The dies are further subdivided into planes, GCUs, erasure blocks, pages, etc. Groups of dies may be arranged into separate NVMe sets, or namespaces. This allows the various NVMe sets to be concurrently serviced for different owners (users).

In one nonlimiting example, a 4 TB SSD has 128 die connected using 8 channels so that 16 die are connected to each channel. Each die has two planes that support concurrent read or write operations to the same page number (but not necessarily the same erasure blocks, EBs). GCUs nominally are formed using one EB from each of 32 dies. Each page stores 16K of data plus LDPC inner code values. GCU writes are thus formed by writing (nominally) 31 pages of user data, and one page of parity (XOR) data. This will support a loss of a single die. EBs represent the smallest increment of memory that can be erased as a unit, but in practice, garbage collection takes place at the GCU level.

Flash devices are noisy and thus it is common to write data in the form of code words to individual pages of data. A page may store 16K worth of user payload data, plus some additional number of LDPC (low density parity check) codes, which may be on the order of an additional 5K or so bits. The number and strength of the LDPC codes are used to enable, normally, correct reading back of the payload. Outercode, or parity values, can additionally be written as noted above to correct read errors when the inner code values are insufficient to resolve the error.

A problem arises in tracking the read and write performance of the various EBs. Normally, when a page of data cannot be successfully recovered using the LDPC inner codes, a number of recovery operations are carried out. These may include read retries, additional LDPC iterations, adjustments in read voltage threshold, application of the parity outer code, etc. Similar write errors can occur when, after a program operation has occurred to write data to a page, a program verify (PV) is carried out to ensure the data were correctly written. These are sometimes referred to as uncorrected read and write errors, since additional effort was required in order to resolve the error other than the normal inner codes.

In the past, one operation that has been carried out in SSDs is to perform a field certification of a given EB once an uncorrected read or write error is experienced. This might include various steps including garbage collecting and erasing the EB, followed by writing a special test pattern the EB, followed by reading the test pattern. This requires several steps, including multiple erases, increased the PE count, and ultimately, may not have fully determined whether the EB was in fact defective or not. For example, immediately reading an EB after programming it may have shown the block to perform correctly, but a few minutes later the EB may fail.

With the advent of IOD performance constraints, a more efficient mechanism is required to evaluate EBs with a view toward either recertifying the blocks or removing failed blocks from service. In accordance with some embodiments, failed memory locations, such as erasure blocks (EBs) in a flash memory, can be certified by accumulating a total number of times that a read recovery operation had to be carried out to read back programmed data. This count is compared to the overall program/erase (PE) count, and if the count is a sufficiently high percentage of the PE count, the memory location is deallocated via removal from service.

Over time, the total number of increments for the various EBs is evaluated. A sliding scale may be used such that the block is declared defective if the incremented error count exceeds some percentage of the overall PE count. For example, if the incremented EB count exceeds 10% of the total PE cycles, this means that one out of every 10 times that block was programmed, it provided data that produced a read or write error that required extended operation to correct. Such thresholds can thus be used to mark EBs as poor performers and remove the blocks from service.

The analysis may not begin until the PE counts reach some measure of operational life, such as 25% into the expected life. This will eliminate early life reliability issues prior to stabilized performance. The scale can be adjusted as the device reaches end of life. In some cases, a relative measure is used so that the worst performing X % of the EBs are retired as end of life approaches, with different thresholds used.

These and other features may be practiced in a variety of different data storage devices, but various embodiments conduct wear range optimization in the example data storage device 100 shown as a simplified block representation in FIG. 1. The device 100 has a controller 102 and a memory module 104. The controller block 102 represents a hardware-based and/or programmable processor-based circuit configured to provide top level communication and control functions. The memory module 104 includes solid state non-volatile memory (NVM) for the storage of user data from one or more host devices 106, such as other data storage devices, network server, network node, or remote controller.

Figure 2:
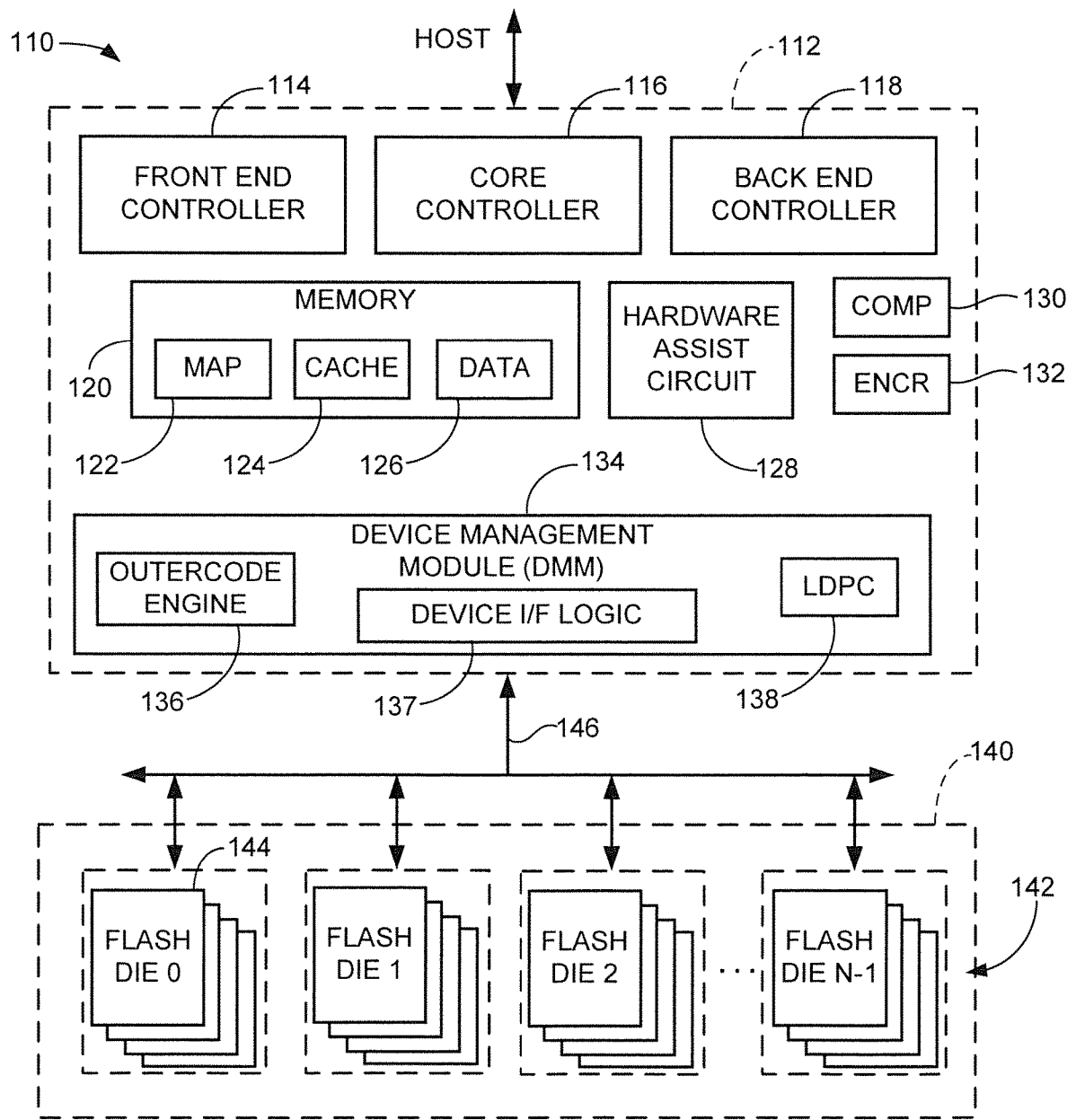
FIG. 2 shows aspects of the device of FIG. 1 characterized as a solid state drive (SSD) in accordance with some embodiments.

FIG. 2 displays an example data storage device 110 generally corresponding to the device 100 in FIG. 1. The device 110 is configured as a solid state drive (SSD) that communicates with one or more host devices via one or more Peripheral Component Interface Express (PCIe) ports, although other configurations can be used. The NVM is contemplated as comprising NAND flash memory, although other forms of solid state non-volatile memory can be used.

In at least some embodiments, the SSD operates in accordance with the NVMe (Non-Volatile Memory Express) Standard, which enables different users to allocate NVMe sets (die sets) for use in the storage of data. Each NVMe set may form a portion of an NVMe Namespace that may span multiple SSDs or be contained within a single SSD.

The SSD 110 includes a controller circuit 112 with a front end controller 114, a core controller 116 and a back end controller 118. The front end controller 114 performs host I/F functions, the back end controller 118 directs data transfers with the memory module 140 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can also be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers.

A non-processor based hardware assist circuit 128 may enable the offloading of certain memory management tasks by one or more of the controllers as required. The hardware circuit 128 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in hardware and/or firmware in the controller 112, such as a data compression block 130 and an encryption block 132. The data compression block 130 applies lossless data compression to input data sets during write operations, and subsequently provides data de-compression during read operations. The encryption block 132 provides any number of cryptographic functions to input data including encryption, hashes, decompression, etc.

A device management module (DMM) 134 supports back end processing operations and may include an outer code engine circuit 136 to generate outer code, a device I/F logic circuit 137 and a low density parity check (LDPC) circuit 138 configured to generate LDPC codes as part of the error detection and correction strategy used to protect the data stored by the by the SSD 110.

A memory module 140 corresponds to the memory 104 in FIG. 1 and includes a non-volatile memory (NVM) in the form of a flash memory 142 distributed across a plural number N of flash memory dies 144. Rudimentary flash memory control electronics (not separately shown in FIG. 2) may be provisioned on each die 144 to facilitate parallel data transfer operations via one or more channels (lanes) 146.

Figure 3:
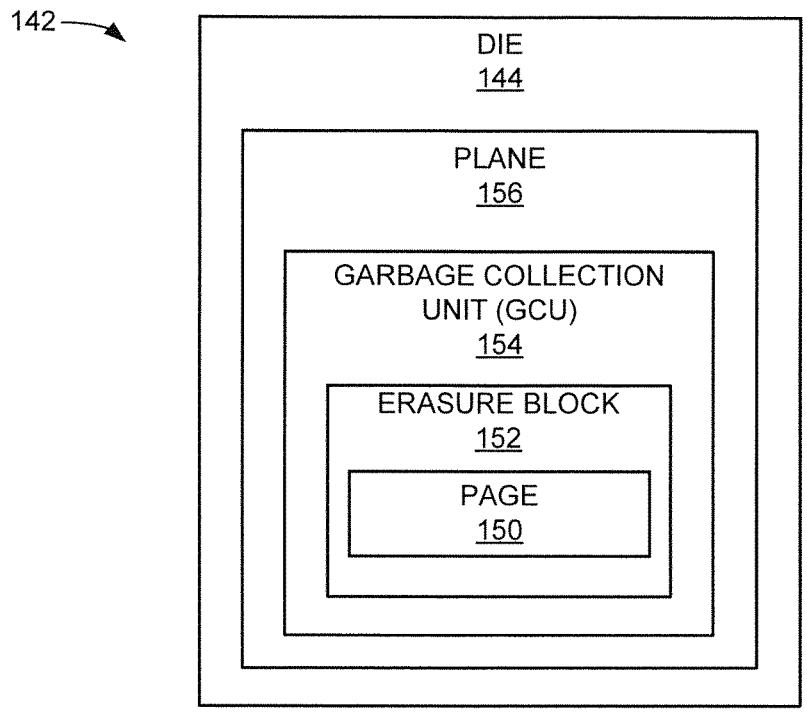
FIG. 3 shows an arrangement of the flash memory of FIG. 2 in some embodiments.

FIG. 3 shows an arrangement of the various flash memory dies 144 in the flash memory 142 of FIG. 2 in some embodiments. Other configurations can be used. The smallest unit of memory that can be accessed at a time is referred to as a page 150. A page may be formed using a number of flash memory cells that share a common word line. The storage size of a page can vary; current generation flash memory pages can store, in some cases, 16 KB (16,384 bytes) of user data.

A number of pages are integrated into an erasure block 152, which represents the smallest grouping of memory cells that can be concurrently erased in a NAND flash memory. A number of erasure blocks 152 can be arranged into a garbage collection unit (GCU) 154, which may utilize erasure blocks across different dies as explained below. GCUs can be allocated for the storage of data. Once a sufficient amount of the stored data is determined to be stale (e.g., no longer the most current version), a garbage collection operation can be carried out to recycle the GCU. This includes identifying and relocating the current version data to a new location, followed by an erasure operation to reset the memory cells. The GCU may then be returned to an allocation pool for subsequent allocation to begin storing new user data.

Each die 144 may include a plurality of planes 156. Examples include two planes per die, four planes per die, etc. although other arrangements can be used. Generally, a plane is a subdivision of the die 144 arranged with separate read/write/erase circuitry such that a given type of access operation (such as a write operation, etc.) can be carried out simultaneously by each of the planes to a common page address within the respective planes.

Figure 4:
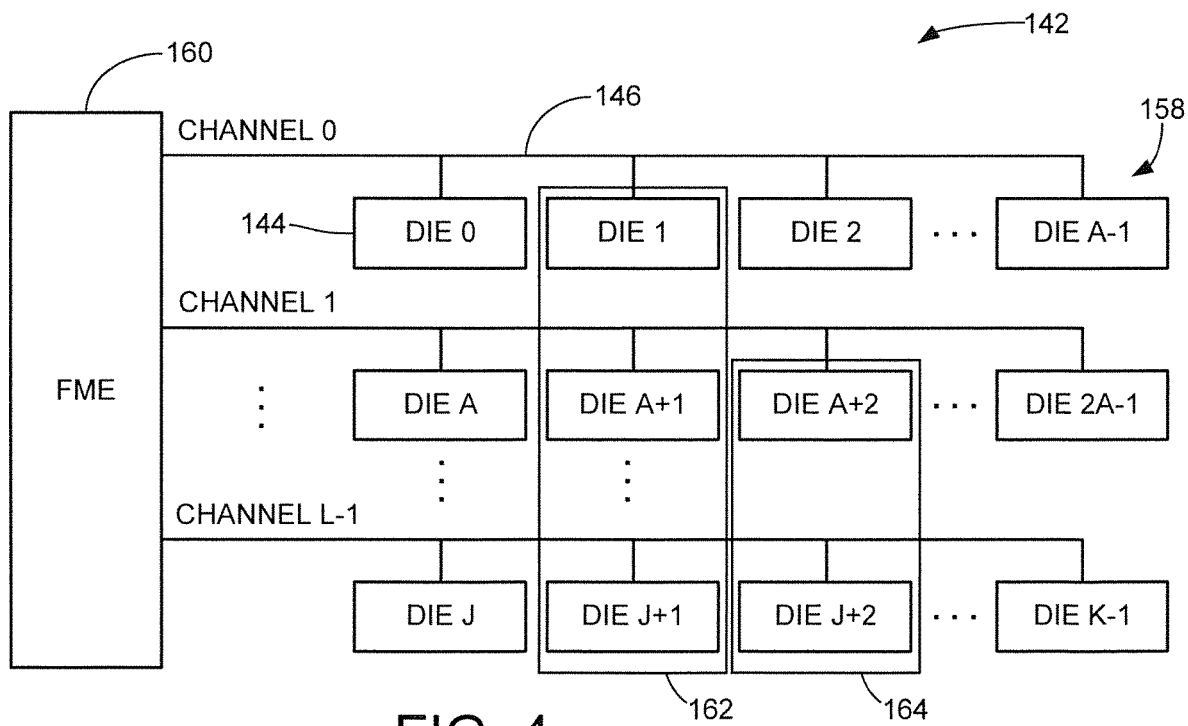
FIG. 4 illustrates the use of channels to access the dies in FIG. 3 in some embodiments.

FIG. 4 shows further aspects of the flash memory 142 in some embodiments. A total number K dies 144 are provided and arranged into physical die groups 158. Each die group 158 is connected to a separate channel 146 using a total number of L channels. In one example, K is set to 128 dies, L is set to 8 channels, and each physical die group has 16 dies. As noted above, a single die within each physical die group can be accessed at a time using the associated channel. A flash memory electronics (FME) circuit 160 of the flash memory module 142 controls each of the channels 146 to transfer data to and from the dies 144.

In some embodiments, the various dies are arranged into one or more NVMe sets. An NVMe set represents a portion of the storage capacity of the SSD that is allocated for use by a particular host (user/owner). NVMe sets are usually established with a granularity at the die level, so that some percentage of the total available dies 144 will be allocated for incorporation into a given NVMe set.

A first example NVMe set is denoted at 162 in FIG. 4. This first set 162 uses a single die 144 from each of the different channels 146. This arrangement provides fast performance during the servicing of data transfer commands for the set since all eight channels 146 are used to transfer the associated data. A limitation with this approach is that if the set 162 is being serviced, no other NVMe sets can be serviced during that time interval. While the set 162 only uses a single die from each channel, the set could also be configured to use multiple dies from each channel, such as 16 dies/channel, 32 dies/channel, etc.

A second example NVMe set is denoted at 164 in FIG. 4. This set uses dies 144 from less than all of the available channels 146. This arrangement provides relatively slower overall performance during data transfers as compared to the set 162, since for a given size of data transfer, the data will be transferred using fewer channels. However, this arrangement advantageously allows the SSD to service multiple NVMe sets at the same time, provided the sets do not share the same (e.g., an overlapping) channel 146.

Figure 5:
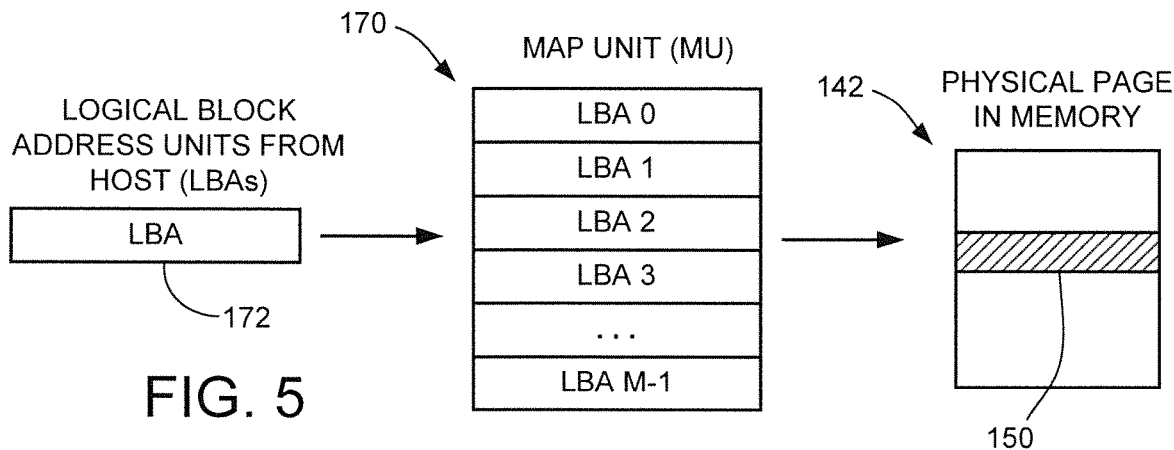
FIG. 5 illustrates a map unit (MU) as a data arrangement stored to the flash memory of FIG. 2.

FIG. 5 illustrates a manner in which data may be stored to the flash memory module 142. Map units (MUs) 170 represent fixed sized blocks of data that are made up of one or more user logical block address units (LBAs) 172 supplied by the host. Without limitation, the LBAs 172 may have a first nominal size, such as 512 bytes (B), 1024 B (1 KB), etc., and the MUs 170 may have a second nominal size, such as 4096 B (4 KB), etc. The application of data compression may cause each MU to have a smaller size in terms of actual bits written to the flash memory 142.

The MUs 170 are arranged into the aforementioned pages 150 (FIG. 3) which are written to the memory 142. In the present example, using an MU size of 4 KB, then nominally four (4) MUs may be written to each page. Other configurations can be used. To enhance data density, multiple pages worth of data may be written to the same flash memory cells connected to a common control line (e.g., word line) using multi-bit writing techniques; MLCs (multi-level cells) write two bits per cell, TLCs (three-level cells) write three bits per cell; XLCs (four level cells) write four bits per cell, etc.

Data stored by an SSD are often managed using metadata. The metadata provide map structures to track the locations of various data blocks (e.g., MUAs 170) to enable the SSD 110 to locate the physical location of existing data. For example, during the servicing of a read command it is generally necessary to locate the physical address within the flash memory 144 at which the most current version of a requested block (e.g., LBA) is stored, so that the controller can schedule and execute a read operation to return the requested data to the host. During the servicing of a write command, new data are written to a new location, but it is still necessary to locate the previous data blocks sharing the same logical address as the newly written block so that the metadata can be updated to mark the previous version of the block as stale and to provide a forward pointer or other information to indicate the new location for the most current version of the data block.

Figure 6:
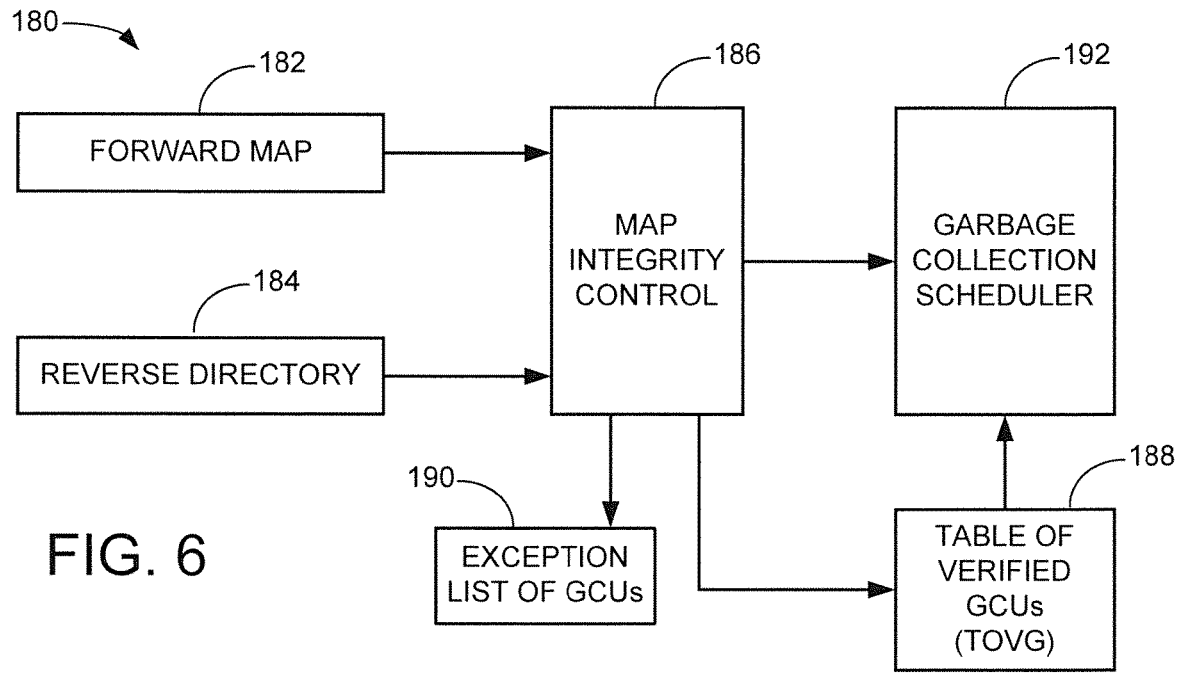
FIG. 6 displays a functional block diagram for a GCU management circuit of the SSD in accordance with some embodiments.

FIG. 6 shows a functional block diagram for a GCU management circuit 180 of the SSD 110 in accordance with some embodiments. The circuit 180 may form a portion of the controller 112 and may be realized using hardware circuitry and/or one or more programmable processor circuits with associated firmware in memory. The circuit 180 includes the use of a forward map 182 and a reverse directory 184. As noted above, the forward map and reverse directory are metadata data structures that describe the locations of the data blocks in the flash memory 142. During the servicing of host data transfer operations, as well as other operations, the respective portions of these data structures are located in the flash memory or other non-volatile memory location and copied to local memory 120 (see e.g., FIG. 2).

The forward map 182 provides a flash transition layer (FTL) to generally provide a correlation between the logical addresses of various blocks (e.g., MUAs) and the physical addresses at which the various blocks are stored (e.g., NVMe set, die, plane, GCU, EB, page, bit offset, etc.). The contents of the forward map 182 may be stored in specially configured and designated GCUs in each NVMe set.

The reverse directory 184 provides a physical address to logical address correlation. The reverse directory contents may be written as part of the data writing process to each GCU, such as in the form of a header or footer along with the data being written. Generally, the reverse directory provides an updated indication of how many of the data blocks (e.g., MUAs) are valid (e.g., represent the most current version of the associated data).

The circuit 180 further includes a map integrity control circuit 186. As explained below, this control circuit 186 generally operates at selected times to recall and compare, for a given GCU, the forward map data and the reverse directory data. This evaluation step includes processing to determine if both metadata structures indicate the same number and identify of the valid data blocks in the GCU.

If the respective forward map and reverse directory match, the GCU is added to a list of verified GCUs in a data structure referred to as a table of verified GCUs, or TOVG 188. The table can take any suitable form and can include a number of entries, with one entry for each GCU. Each entry can list the GCU as well as other suitable and useful information, such as but not limited to a time stamp at which the evaluation took place, the total number of valid data blocks that were determined to be present at the time of validation, a listing of the actual valid blocks, etc.

Should the control circuit 186 find a mismatch between the forward map 182 and the reverse directory 184 for a given GCU, the control circuit 186 can further operate to perform a detailed evaluation to correct the mismatch. This may include replaying other journals or other data structures to trace the history of those data blocks found to be mismatched. The level of evaluation required will depend on the extent of the mismatch between the respective metadata structures.

For example, if the forward map 182 indicates that there should be some number X valid blocks in the selected GCU, such as 12 valid blocks, but the reverse directory 184 indicates that there are only Y valid blocks, such as 11 valid blocks, and the 11 valid blocks indicated by the reverse directory 184 are indicated as valid by the forward map, then the focus can be upon the remaining one block that is valid according to the forward map but invalid according to the reverse directory. Other mismatch scenarios are envisioned.

The mismatches can arise due to a variety of factors such as incomplete writes, unexpected power surges or disruptions that prevent a full writing of the state of the system, etc. Regardless, the control circuit can expend the resources as available to proactively update the metadata. In some embodiments, an exception list 190 may be formed as a data structure in memory of GCUs that have been found to require further evaluation. In this way, the GCUs can be evaluated later at an appropriate time for resolution, after which the corrected GCUs can be placed on the verified list in the TOVG 188.

It will be noted that the foregoing operation of the control circuit 186 in evaluating GCUs does not take place once a garbage collection operation has been scheduled; instead, this is a proactive operation that is carried out prior to the scheduling of a garbage collection operation. In some cases, GCUs that are approaching the time at which a garbage collection operation may be suitable, such as after the GCU has been filled with data and/or has reached a certain aging limit, etc., may be selected for evaluation on the basis that it can be expected that a garbage collection operation may be necessary in the relatively near future.

Figure 8:
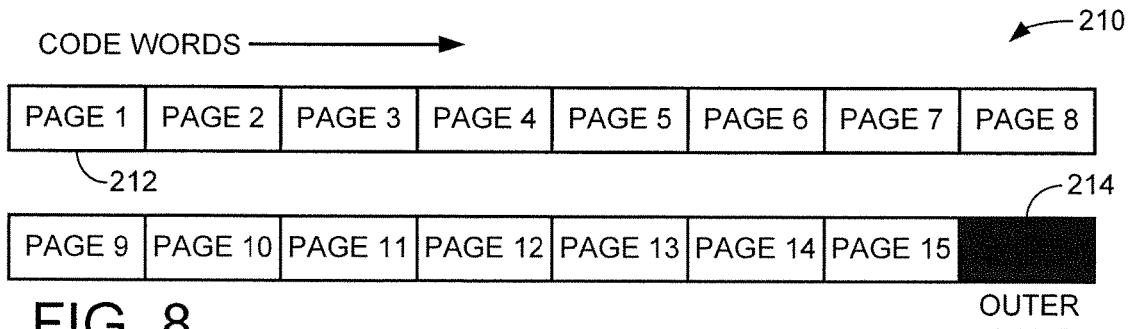
FIG. 8 illustrates an example data set that can be written to the data storage device of FIG. 1 in accordance with assorted embodiments.

FIG. 8 further shows the GCU management circuit 180 to include a garbage collection scheduler circuit 192. This circuit 192 generally operates once it is appropriate to consider performing a garbage collection operation, at which point the circuit 192 selects from among the available verified GCUs from the table 188. In some cases, the circuit 192 may generate a time of completion estimate to complete the garbage collection operation based on the size of the GCU, the amount of data to be relocated, etc.

As will be appreciated, a garbage collection operation can include accessing the forward map and/or reverse directory 182, 184 to identify the still valid data blocks, the reading out and temporary storage of such blocks in a local buffer memory, the writing of the blocks to a new location such as in a different GCU, the application of an erasure operation to erase each of the erasure blocks in the GCU, the updating of program/erase count metadata to indicate the most recent erasure cycle, and the placement of the reset GCU into an allocation pool awaiting subsequent allocation and use for the storage of new data sets.

Figure 7:
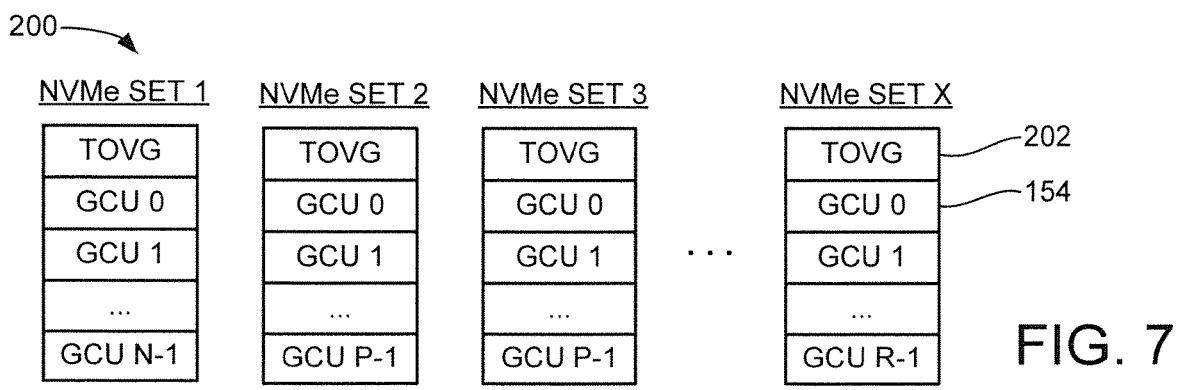
FIG. 7 represents an arrangement of various GCUs and corresponding tables of verified GCUs (TOVGs) for a number of different NVMe sets in some embodiments.

FIG. 7 shows a number of NVMe sets 200 that may be arranged across the SSD 110 in some embodiments. Each set 200 may have the same nominal data storage capacity (e.g., the same number of allocated dies, etc.), or each may have a different storage capacity. The storage capacity of each NVMe set 200 is arranged into a number of GCUs 154 as shown. In addition, a separate TOVG (table of verified GCUs) 202 may be maintained by and in each NVMe set 200 to show the status of the respective GCUs. From this, each time that it becomes desirable to schedule a garbage collection operation, such as to free up new available memory for a given set, the table 202 can be consulted to select a GCU that, with a high degree of probability, can be subjected to an efficient garbage collection operation without any unexpected delays due to mismatches in the metadata (forward map and reverse directory).

FIG. 8 illustrates a manner in which a parity data set 210 can be written to a selected GCU 154 in the flash memory 142 in accordance with some embodiments. In this example, it is contemplated that the selected GCU 154 is formed from sixteen (16) erasure blocks 152, with each of the erasure blocks disposed on a different die 144. Other sizes can be used as desired.

In FIG. 8, the parity data set has fifteen (15) user data pages 212, with each user data page, or payload, written to a different one of the dies. More generally, the GCU has N erasure blocks on a corresponding N dies, and payloads 212 are written to N−1 of the dies. The Nth die receives an outer code (parity value), which is represented at 214. As mentioned above, the outer code may be generated by summing the page data in a buffer using an XOR function. Because the parity data set 210 has data boundaries that nominally match the GCU boundaries, the parity data set in FIG. 8 is referred to as a standard parity data set since the data matches the available memory.

Figure 9:
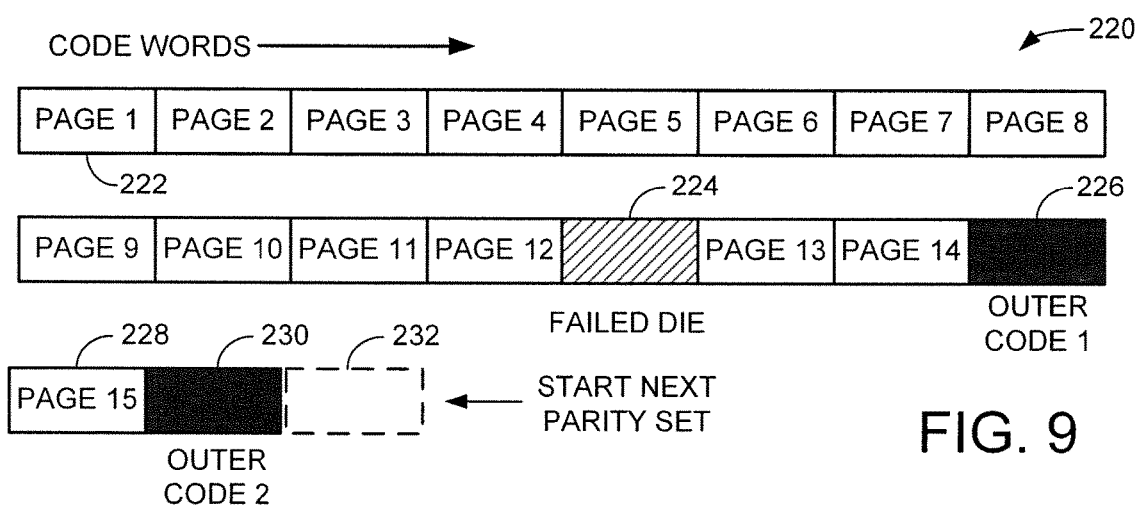
FIG. 9 is an example non-standard data set that may occur in the data storage device of FIG. 1 in accordance with various embodiments.

FIG. 9 shows a non-standard parity data set 220. The parity data set 220 is the same size as the parity data set 210 in FIG. 8 in that, as before, the parity data set 220 has a total of fifteen (15) pages/payloads 222. However, one of the dies 144 has experienced a failure, as indicated at 224, so that the GCU only spans 15 dies.

Accordingly, the controller circuit 112 (FIG. 2) operates to write a full set of the available pages, which in this case is Page 1 to Page 14, through the available dies. This is followed by the writing of a first outer code (parity value) in the Nth location, as shown at 226, which protects the payloads (Page 1 to Page 14) written during this first pass through the available dies.

A leftover payload 228 (Page 15) is written to the next available page in the first die (such as adjacent Page 1). This leftover payload is referred to as a runt or runt data, and represents the remainder after an integer number of passes have been made through the available dies. Once all of the leftover payloads have been written, a second outer code (parity value) is written in the next available die, as shown at 230. This second outer code is disposed in the same die as, and is adjacent to, the Page 2 payload.

In this way, when leftover (runt) payload sets remain, these are written to as many additional dies as are required, followed by the writing of a final parity value to cover the runts. Map data may be generated to note the non-standard outer code arrangement. This provides a parity data set with a parity value to protect each pass through the dies, plus another parity value to cover the remainder.

While FIG. 9 shows the non-standard parity data set has arisen due to a non-standard sized available memory (e.g., due to the die failure at 224), other non-standard parity data sets can arise based on other factors. For example, a particular data set to be written to a given NVMe set may make up a total number of MUs that do not align with the GCU boundaries. In another case, data compression or other processing may result in a non-standard sized parity data set. It will be appreciated that if a given GCU has N dies, then a non-standard sized data set will have a total number M payloads (or portions thereof) that are not divisible by N without a remainder. The remainder could be any value from one extra payload up to N−1 extra payloads. Regardless, each pass through the dies will be parity protected, irrespective of the overall length of the parity data set.

Once a non-standard parity set is written, map data may be generated and stored to indicate the fact that the parity data set is of non-standard length. Information may be stored in the map data such as how much longer the data set is in terms of additional pages in the remainder, the location of the last parity value (e.g., 230), etc. To maximize data density, the controller may operate to initiate the writing of the next parity data set at the next available page on the next die in the sequence, as shown at 232 in FIG. 9.

Figure 10:
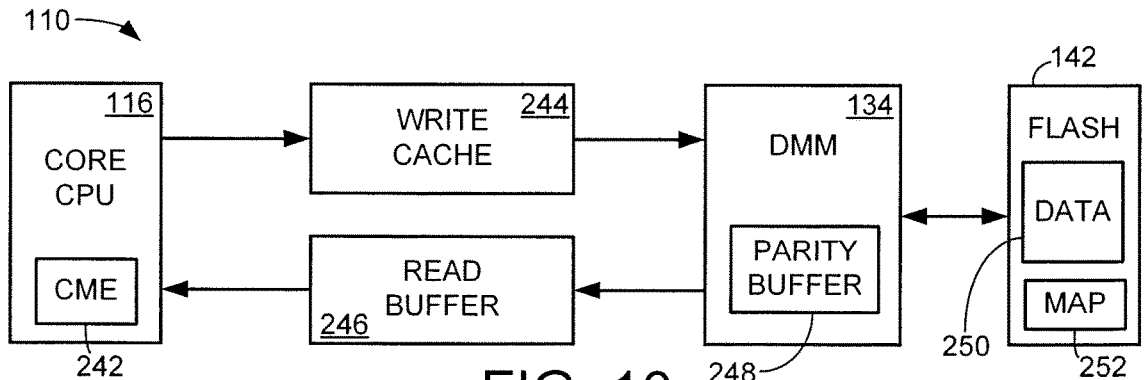
FIG. 10 shows a functional block representation of an example data storage device configured in accordance with some embodiments.

FIG. 10 shows a functional block representation of additional aspects of the SSD 110. The core CPU 116 from FIG. 2 is shown in conjunction with a code management engine (CME) 212 that can be used to manage the generation of the respective code words and outer code parity values for both standard and non-standard parity data sets During write operations, input write data from the associated host are received and processed to form MUs 170 (FIG. 5) which are placed into a non-volatile write cache 244 which may be flash memory or other form(s) of non-volatile memory. The MUs are transferred to the DMM circuit 134 for writing to the flash memory 142 in the form of code words that contain user data, inner code, and outer code. During read operations, one or more pages of data are retrieved to a volatile read buffer 246 for processing prior to transfer to the host.

The CME 242 determines the appropriate inner and outer code rates for the data generated and stored to memory. In some embodiments, the DMM circuit 134 may generate both the inner and outer codes. In other embodiments, the DMM circuit 134 generates the inner codes (see e.g., LDPC circuit 138 in FIG. 2) and the core CPU 116 generates the outer code words. In still other embodiments, the same processor/controller circuit generates both forms of code words. Other arrangements can be used as well. The CME 242 establishes appropriate code rates for both types of code words.

During generation of the outer codes, a parity buffer 248 may be used to successively XOR each payload being written during each pass through the dies. Both payload data 250 and map data 252 will be stored to flash 142.

Figure 11:
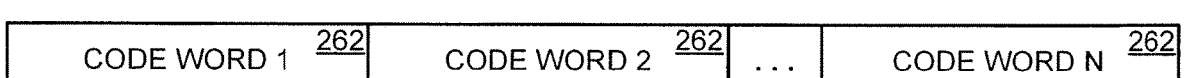
FIG. 11 displays a block representation of portions of an example data storage device arranged in accordance with assorted embodiments.
Figure 11:

FIG. 11 is a block representation of portions of an example data storage device 260 in which data is arranged into a plurality of code words 262 that can efficiently be stored, and retrieved, from one or more SSD storage destinations. A page 150 of data may comprise a number of consecutive, or non-consecutive, code words 262 organized to effectively fit in the available space of an SSD.

As shown, a code word 262 can consist of user data 264 and inner code 266 generated to complement the user data 264, such as by the LDPC circuitry 138. The inner code 266 can provide a diverse variety of capabilities, such as error correction via error correction code (ECC), data status, data offset, and other data control information. The combination of user data 264 and inner code 266 together in a code word 262 allows for efficient analysis, verification, and correction (if necessary) of errors in reading, or writing, the user data 264 to/from memory. However, the inner code 266 may be insufficient, in some cases, to overcome and/or correct errors associated with storage of the code word 262. Hence, various embodiments generate outer code that provides higher-level data analysis and correction in complementary fashion to the inner code 266.

Figure 12:
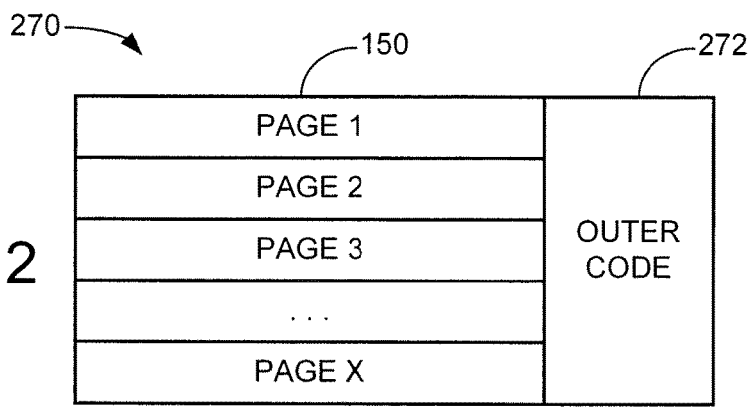
FIG. 12 shows a block representation of portions of an example data storage device configured in accordance with various embodiments.

FIG. 12 conveys a block representation of a portion of an example data storage device 270 where pages 150 of code words 262 are stored in combination with outer code 272 in accordance with some embodiments. The outer code 272 may be associated with one or more pages 150 of code words to provide data that describes the constituent code words 262 and allows for verification and correction of the accuracy, and reliability, of the user data of the respective code words 262.

It is contemplated that the outer code 272 can operate to correct errors and faults that occur during the reading, or writing, of the code words 262. Such corrective function of outer code 272 allows user data to be retrieved despite encountered errors/faults that were uncorrectable by inner code 266. In some embodiments, a probation counter for the user data and/or the physical address of memory where the user data 264 is stored is maintained in the inner code 266, outer code 272, or elsewhere in memory to allow a physical address and/or user data to be monitored in real-time with simple polling of the probation counter.

Figure 13:
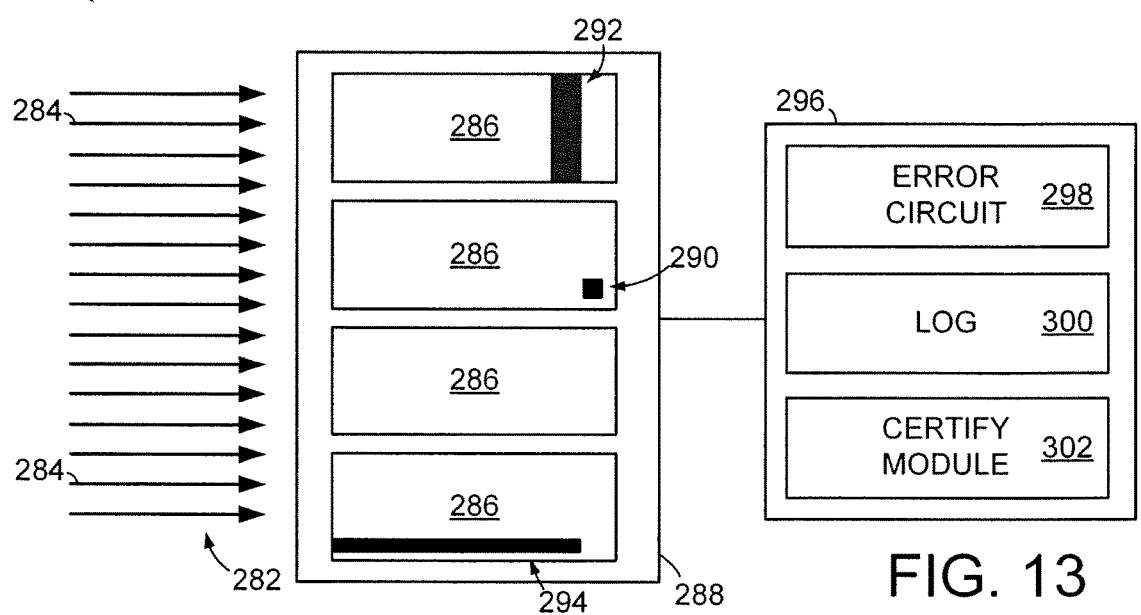
FIG. 13 conveys an example data storage system in which various embodiments can be practiced.

FIG. 13 displays portions of an example data storage system 280 configured and operated in accordance with various embodiments to mitigate and/or eliminate command conflicts. As shown, the data storage device 280 has at least one command queue 282 consisting of pending data access commands 284, such as data reads, data writes, and data erases. The data access commands 284 are assigned by an upstream host to a particular die 286 and logical block address in one or more data storage devices 288. Depending on the configuration of the command queue 282, the commands 284 are executed via one or more channels by at least one local controller in a predetermined order, such as first-in first-out (FIFO), round robin, or by destination die 286.

Under normal conditions, the pending commands 284 are executed to various EBs of the assorted dice 286 as assigned. However, failures can occur in one or more dice 286 that require pending data access commands 284 to be delayed or reassigned to other physical locations. Such failures can degrade the performance of the data storage device 308 as commands can be lost, conflicted, or postponed in a manner that jeopardizes the integrity of the underlying data. It is noted that a failure may be a permanent, or temporary, fault, condition, or occurrence for one or more portions of a data storage device 288, such as a die 286, channel, or local controller. It is further noted that a failure can occur in any portion of a die 286, such as the non-limiting memory cell 290, complete erasure block 292, or partial erasure block 294 shown in FIG. 13.

To identify the occurrence, and location, of data access errors, at least one monitor module 296 can be connected to each data storage device 288. Although not required, some embodiments arrange the monitor module 296 with an error circuit 298 that can detect when an error, fault, or abnormal condition has occurred during the execution of one or more data access commands 284. The error circuit 298 can be configured to analyze a detected situation to identify the type of error, timing of the error, and performance impact of the error. It is contemplated that the error circuit 298 consults a log 300 of past data access command 284 executions to detect, and classify, errors in real-time. As a result of identified errors, a probation bit corresponding with the failed EB, die 286, and/or data storage device 288 can be incremented to track the quality of service of the respective portions of the data storage system 280 over time.

Once a memory cell 290, EB 294, or other portion of a die 286 has an error that results in a probation bit count, the monitor module 296 can undergo certification of the quality, integrity, and accuracy of the failed portion of the system 280 with a certify module 302. It is noted that the probation bit count can be stored in one or more locations within a data storage system, such as in a temporary buffer, permanent buffer, log 300, in a designated die 286, or elsewhere.

Figure 14:
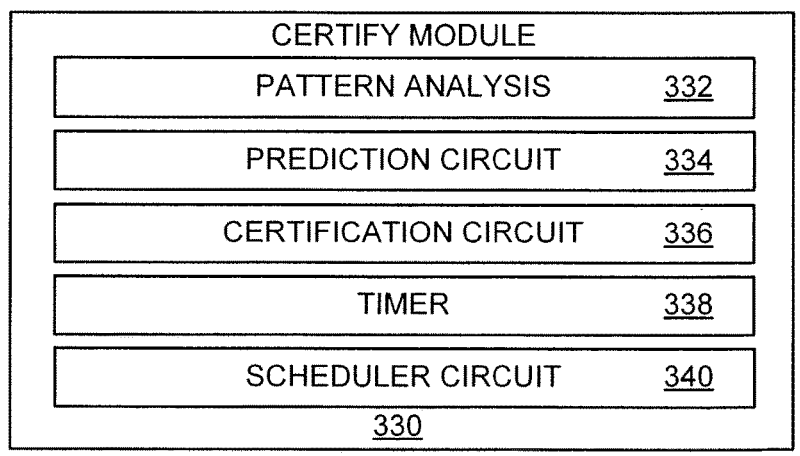
FIG. 14 depicts a block representation of an example certify module that can be utilized by the various embodiments of FIGS. 1-13 in accordance with some embodiments.

FIG. 14 depicts a block representation of an example certify module 302 that can be employed by a monitor module 296 as part of a data storage system. The certify module 302 can have pattern analysis circuitry 310 that correlates the number of errors, frequency of errors, and configuration of a memory to determine if the reliability of the die/EB/data storage device is currently compromised. That is, the pattern analysis circuitry 310 can identify if past errors are likely to reduce the accuracy of future data access command execution. Hence, the pattern analysis circuitry 310 can survey the pending command queue 282 as well as model data and algorithms to calculate the likelihood of future errors occurring when writing, erasing, or reading to a portion of memory.

However, the pattern analysis circuitry 310, and error circuit 298 of FIG. 13, may each be limited to the detection of current and past errors. Accordingly, the certify module 302, and/or monitor module 296 of FIG. 13, may consist of a prediction circuit 312 that processes current, and past, detected data access conditions to forecast if, and potentially when, a memory cell, erasure block, memory die, or data storage device will experience a fault that triggers a probation counter to increment. Such predicted faults may be the same, or different, than past experienced faults and can correspond at least to the number of writes/erases, time between writes, heat associated with a memory die, and number of pending writes/erases to a particular portion of memory.

Any predicted faults can be supported by model data of data accesses, and corresponding faults, from other data storage systems. As probation bit counters for various portions of a memory increase with detected, and predicted, fault tendencies, a local data storage system controller can proactively, and reactively, activate a certification circuit 314 that directs one or more measures to evaluate if a portion of memory is unreliable for future data accesses. While not required or limiting, certification measures can involve taking a portion of memory offline, writing a test pattern of data to the memory, and detecting data resistance ranges for one or more memory cells. The certification circuit 314 may also utilize a timer 316 to wait a predetermined amount of time after writing a test pattern during memory certification before reading data, such as 10 minutes. Waiting after a certification write can ensure a tested memory cell has settled to a static resistance The analysis of unreliability by the certification circuit 314 may be subjective, or objective, and based on various parameters, such as priority of data stored in the memory, average number of accesses over time, and scheduled data maintenance operations. The results of an unreliable designation from the pattern analysis circuit 310 or prediction circuit 312 can trigger a local controller to retire the unreliable memory from further use, which may involve moving existing data to a different physical location and updating map and journal data to remove physical block addresses from data access and maintenance operations. In the event that the certification circuit 314 deems memory reliable for future use, a probation count for the corresponding portion of memory can be reset, reduced by a factor, such as half, or maintained so that each data access triggers a new certification procedure for that portion of memory.

A determination that a portion of memory is unreliable may also involve a scheduler circuit 318 reorganizing pending data accesses and data maintenance operations. For instance, the scheduler circuit 318 may reassign physical block addresses for pending new data or data updates to data resident in unreliable portions of memory. The scheduler circuit 318 may also reorganize scheduled maintenance operations, such as garbage collection and map updates, to avoid an unreliable portion of memory and/or prioritize data access processing in moving existing data from an unreliable portion of memory.

In accordance with some embodiments, a probation bit count can be stored locally in a memory of a data storage device. Such a probation counter can be incremented in response to detected, or predicted, memory faults/errors. It is contemplated that a probation bit is stored in the outer code of a parity set, within each page of a parity set, or in a probation count table that comprises a plurality of probation counts for different portions of memory of a data storage device. The local storage of a probation bit allows the monitor module 296 and certify module 302 to more quickly take corrective action than if a probation bit was stored remotely from a data storage device. Hence, a local controller can selectively keep probation counters for any volume of memory in a data storage device and selectively store those counters anywhere in local media, which allows the controller to optimize probation bit management without being constrained by set memory volumes or storage locations.

Figure 15:
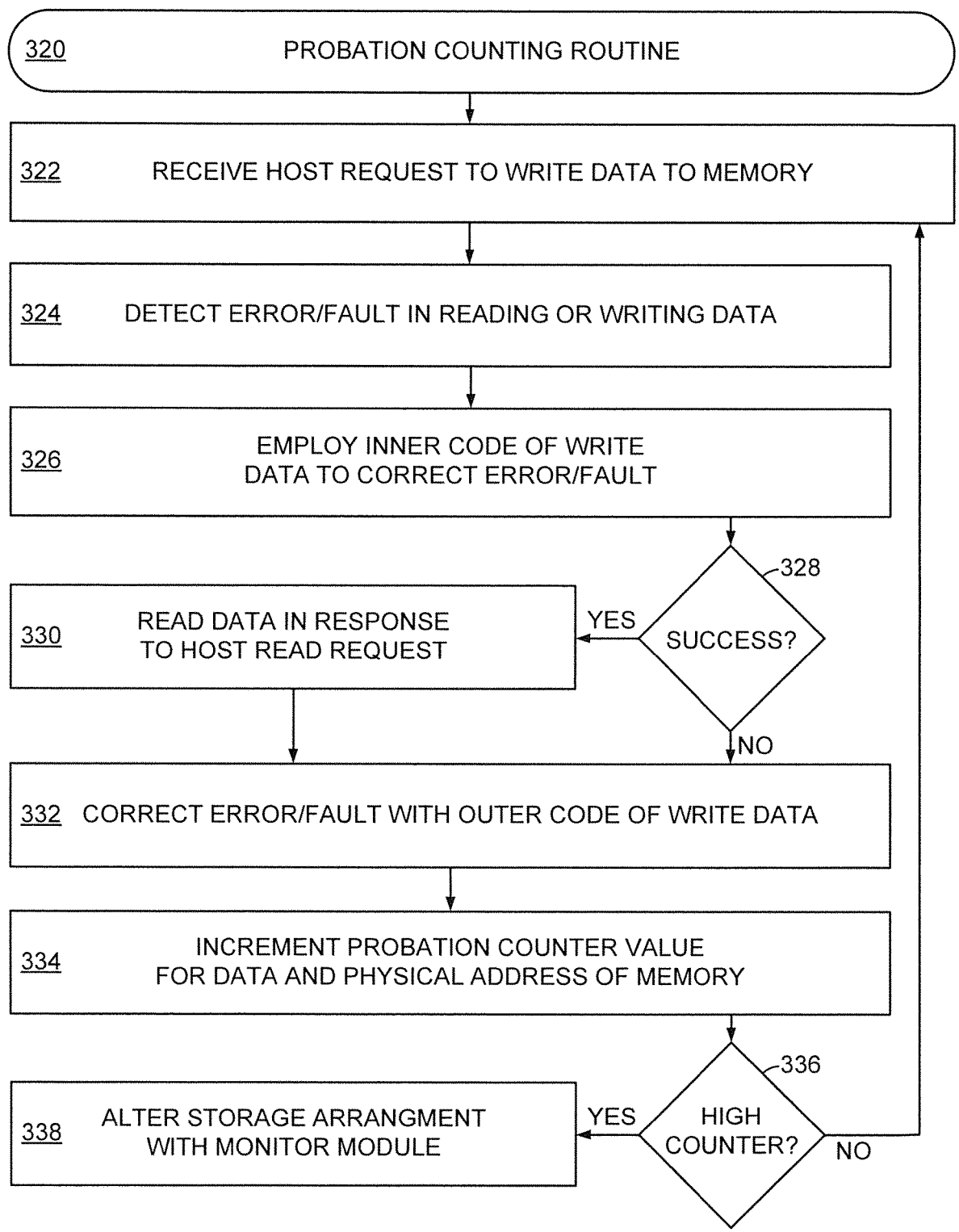
FIG. 15 is a flowchart of an example probation counting routine that can be carried out by the assorted embodiments of FIGS. 1-14.

FIG. 15 is a flowchart of an example probation counting routine 320 that can be carried out with the assorted embodiments of FIGS. 1-14. The routine 320 has a data storage system configured with a controller connected to a semiconductor memory, a monitor module, and a certify module. Step 322 receives at least one request from an external host to write data to the semiconductor memory. The data of the write request is compiled into a code word by a local controller and an attempt to write the code data associated with the write request of step 322 is conducted prior to an error, and/or fault, being discovered in step 324. That is, step 324 can detect an error/fault in writing the data of the write request from step 322 or in subsequently reading the data of the write request from step 322.

The detected error from step 324 is handled in step 326 by utilizing inner code of the code word of the write data associated. The inner code may, or may not, accomplish a correction of the detected error/fault. Decision 328 evaluates if the detected read, or write, error was successfully corrected. If so, step 330 proceeds to read the corrected data in response to a received read request from an external host. However, an unsuccessful error/fault correction prompts step 332 to attempt to correct the detected error/fault with outer code associated with the code word and/or physical address of the semiconductor memory where the code word is stored.

In the event no correction can be made with the outer code, the uncorrected code word, and physical address in the semiconductor memory, is labeled as unusable and supplemental actions, such as retrying to write the code word in other storage locations, is carried out. On the other hand, if the outer code was able to correct the detected error/fault of the write data from step 322 and/or the physical address where the write data was stored, a probation counter value is incremented by a modify module in step 334 to indicate that the data and/or physical storage location is increasingly problematic and worthy of heightened scrutiny for future data storage operations.

Over time, a physical storage location may accumulate a relatively high probation counter value, such as 10% of the overall data accesses (PE) to the physical memory location. A high probation counter value can trigger step 338 to alter the storage arrangement for the associated physical memory location with the monitor module. Such alteration of a storage arrangement may delay data access operations until the memory location can be certified, may deallocate the memory location, or may reschedule data access operations to the memory location commensurate with the increased risk of data access errors when storing data in the memory location.

What is claimed is:

1. A method comprising:
   receiving a data write request to write data to a physical address of a non-volatile semiconductor memory;
   detecting an error while storing the write data to the physical address;
   evaluating a data storage integrity of the physical address after the detected error with a monitor module;
   correcting the error with the monitor module connected to the non-volatile semiconductor memory;
   incrementing a counter associated with the physical address with the monitor module in response to the corrected error; and
   reading the data in response to a data read request.

2. The method of claim 1, wherein the error is detected by an error circuit of the monitor module.

3. The method of claim 1, wherein the data write request and one or more data read requests are stored in a log maintained by the monitor module.

4. The method of claim 3, wherein the monitor module detects the error in real-time by consulting the log.

5. The method of claim 1, wherein a certify module of the monitor module evaluates the data storage integrity of the physical address after the detected error.

6. The method of claim 5, wherein the certify module comprises a pattern analysis circuit that determines a reliability of the physical address based on the counter associated with the physical address.

7. The method of claim 5, wherein the certify module comprises a prediction circuit that forecasts when the physical address with experience a fault that triggers the counter to be incremented.

8. The method of claim 5, wherein the certify module comprises a certification circuit configured to write at least one test pattern to the physical address to determine the data storage integrity.

9. The method of claim 8, wherein the certification circuit employs a timer to wait a predetermined time after writing the at least one test pattern before testing the physical address.

10. The method of claim 5, wherein the certify module comprises a scheduler circuit configured to reorganize at least one pending data access operations to the physical address in response to a determination that the physical address is unreliable by the certify module.

11. A method comprising:
receiving a request to write data to a physical address of a non-volatile semiconductor memory;
detecting an error while storing the write data to the physical address;
correcting the error with a monitor module connected to the non-volatile semiconductor memory;
incrementing a counter associated with the physical address in response to the corrected error; and
deallocating the physical address responsive to the counter reaching a selected percentage of a total number of program/erase (PE) cycles applied to the physical address.

12. The method of claim 11, wherein the write data comprises at least one code word comprising a data payload, an inner code and an outercode, the outercode.

13. The method of claim 12, wherein the outercode is operable to correct uncorrected errors during a data transfer operation using the data payload and the inner code.

14. The method of claim 11, wherein the counter is incremented in response to the outercode being used to recover the data payload.

15. The method of claim 11, wherein the counter corresponding to the physical address is adjusted by a certification circuit of the monitor module in response to the physical address being deemed reliable for future data storage.

16. The method of claim 15, wherein the certification circuit measures a resistance range for the physical address in response to a test pattern to determine data storage reliability.

17. The method of claim 11, wherein the counter is incremented in response to a predicted data storage fault.

18. The method of claim 11, wherein the monitor module deallocates the physical address from future deterministic window operations in response to a value of the counter.

19. An apparatus comprising:
a non-volatile semiconductor memory having a plurality of physical addresses;
a monitor module connected to the non-volatile semiconductor memory and comprising a certify module to evaluate a data storage integrity of the physical address after the detected error; and
a counter stored in the non-volatile semiconductor memory, the counter incremented by the monitor module in response to correction of a detected error to data written to a physical address of the plurality of physical addresses.

20. The apparatus of claim 19, wherein the detected error is to an entire erasure block of the non-volatile semiconductor memory containing multiple physical addresses of the plurality of physical addresses.

* * * * *